United States Patent [19]

Baker et al.

[11] 3,781,609

[45] Dec. 25, 1973

[54] A SEMICONDUCTOR INTEGRATED CIRCUIT CHIP STRUCTURE PROTECTED AGAINST IMPACT DAMAGE FROM OTHER CHIPS DURING CHIP HANDLING

[75] Inventors: Theodore H. Baker; Majid Ghafghaichi; Paul A. Totta, all of Poughkeepsie, N.Y.

[73] Assignee: International Business Machines Corporation, Armonk, N.Y.

[22] Filed: Nov. 3, 1971

[21] Appl. No.: 195,432

[52] U.S. Cl. .......................... 317/101 A, 317/234 N

[51] Int. Cl. .......................... H04l 19/00

[58] Field of Search .......................... 29/574–580; 317/161 A, 235

[56] References Cited

UNITED STATES PATENTS

| | | | |
|---|---|---|---|
| 3,656,030 | 4/1972 | Napoli et al. | 317/235 |
| 3,591,839 | 6/1971 | Evans | 317/235 |
| 3,484,933 | 12/1969 | Hagon | 29/577 |

*Primary Examiner*—David Smith, Jr.
*Attorney*—Julius B. Kraft et al.

[57] ABSTRACT

A semiconductor integrated circuit chip structure is provided in which one or more bumper projections extending from the active surface of the chip and spaced from the electrical contact projections on said surface functions to protect said active chip surface from impact damage caused by other chips which randomly contact the chip surface during handling procedures particularly when such handling procedures involve placing the chips in random contact with each other in a vibratory article feeding apparatus, such as a vibratory bowl.

7 Claims, 7 Drawing Figures

SEMICONDUCTOR INTEGRATED CIRCUIT CHIP STRUCTURE PROTECTED AGAINST IMPACT DAMAGE FROM OTHER CHIPS DURING CHIP HANDLING

BACKGROUND OF THE INVENTION

The present invention relates to planar semiconductor integrated circuit chip structures, and is particularly directed to the protection of such chip structures during chip handling.

Standard semiconductor integrated circuit chips which are planar have an active or planar surface from which the active and passive devices extend into the chip. The metallization or wiring pattern which interconnects the active and passive devices also extends over this surface, appropriately separated from the surface by an insulative layer of a material such as silicon dioxide. This interconnected surface is then covered by a protective top layer of an insulative material, usually glass. The electrical contact projections or pads connected to the metallization pattern and the devices extend through contact openings or holes in the protective glass layer to make appropriate connections.

During semiconductor fabrication, after the wafer from which the chips are cut is diced into said chips, the diced chips which may be in the order of hundreds from each wafer must then be suitably handled for orientation, chip placement and testing purposes. For such handling purposes, it is customary to handle the chips in such a manner that the chips may randomly contact and impact each other. For example, a typical chip handling apparatus is the vibratory feeding and orienting bowl, such as that described in U.S. Pat. No. 3,426,883. In such apparatus, the chips are randomly piled in the center of the bowl, and as the bowl vibrates, the vibration feeds the chips up a spiral track along the side of the bowl for orientation and dispersal purposes. Also, chips may be randomly stored between handling steps or even as inventory, after completion, in receptacles in which the chips are randomly piled on each other. In many types of handling equipment, the chips are pulled by vacuum or propelled by air pressure into such receptacles whereby the chips impact each other at high velocities.

We have found that during such handling, there is a tendency for a corner of one chip to impact the active or planar surface of another chip with sufficient force so that the protective layer over the active or planar surface is damaged, resulting in either an exposure of the underlying active surface or a short-circuit between the metallization pattern and the surface or between a pair of lines in the metallization pattern. Such defects render the chip unusable. With the increasing density of integrated circuits, particularly large scale integrated circuits, and the corresponding higher cost of individual chips, it is becoming increasingly necessary to protect chips from such damage.

SUMMARY OF THE INVENTION

Accordingly, the primary object of the present invention is to provide a semiconductor integrated chip structure which can withstand the effects of random impact with other chips during chip handling.

Another object of the present invention is to provide a structure in which the active or planar surface of the integrated circuit chip is prevented from being damaged during random impact with another chip in handling.

It is a further object of the present invention to provide a chip structure in which the planar surface is protected from such impact damage, which chip may be produced without any additional chip fabrication steps.

It is an even further object of the present invention to provide a chip structure in which the planar surface is protected from such impact damage, which structure does not entail any additional expedients or problems in chip mounting or handling.

The present invention provides a semiconductor integrated chip structure in which the chip has preselected height, width and length dimensions and which structure comprises a plurality of spaced conductive electrical contact projections from the insulated planar surface of the chip. In addition to the spaced contact projections, there is at least one bumper projection extending from said surface, spaced from sad contact projections; the bumper projection and the contact projections are disposed, with respect to each other and with respect to the dimensions of the chip, in a preselected configuration, such that a corner of another chip of the same structure and dimensions is inhibited by the configuration of projections from contacting and thus impacting selected areas on the chip surface between the projections at such times when the chips are randomly contacting and impacting each other during the handling operations.

Preferably, the height of the bumper projection above the surface of the chip does not exceed the height of any one of the contact projections. Otherwise, in some chip designs, the bumper projection could interfere with the mounting of the chip upon a substrate such as a ceramic substrate containing a pattern of metallized lands. For best results in the fabrication of the bumper or bumpers, they are of the same height and of the same conductive materials as the contact projections. This permits the bumper and contact pads to be fabricated simultaneously in the same process step or steps.

The foregoing and other objects, features and advantages of the invention will be apparent from the following more particular description and preferred embodiments of the invention as illustrated in the accompanying drawings.

DESCRIPTION OF THE PREFERRED EMBODIMENTS

Figure 1:
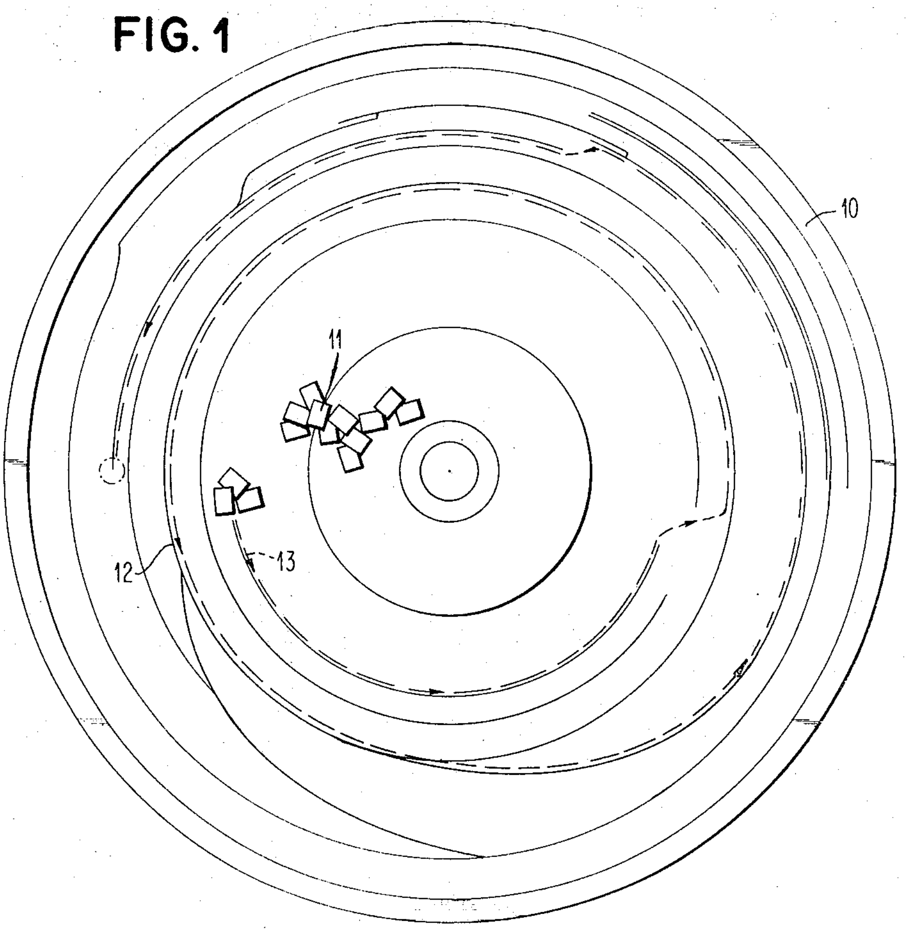
FIG. 1 is a diagrammatic top view of a vibratory bowl showing a group of chips randomly piled in the center in contact with each other.
Figure 1A:
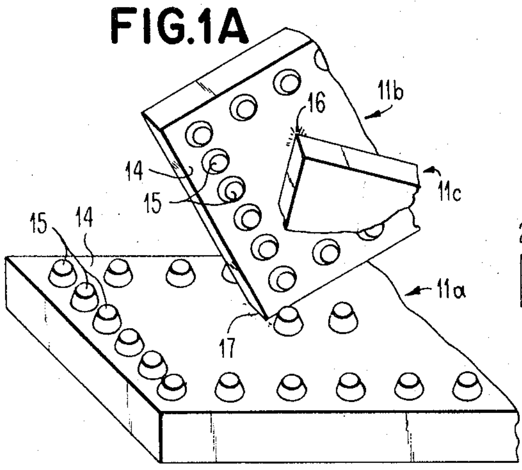
FIG. 1A is a fragmentary, enlarged, perspective view of three chips in the bowl of FIG. 1 in contact with each other in order to illustrate how random impact between the chips may damage each other.

In FIG. 1, a vibratory feeder bowl 10 used in the dispersal, orientation and feeding of chips for testing or mounting is shown. Chips 11 are piled in a random fashion in the center of the bowl. The vibrations of the bowl cause the chips to move up along paths 12 along the sides of the bowl in the direction shown by the dotted lines 13. With a great many chips 11 piled in the center of the bowl, repeated impact between the chips is customary. FIG. 1A shows how the corners of the chips may damage the planar surfaces of other chips. Three chips, 11*a*, 11*b* and 11*c*, are shown contacting each other. The chips shown diagrammatically comprise an insulative planar surface 14 from which conductive contact pads 15 extend. The point corner 16 of chip 11*c* is shown impacting planar surface 14 of chip 11*b*, while edge corner 17 of chip 11*b* is shown impacting planar surface 14 of chip 11*a*. Such impacts may, in many instances, damage the insulative, protective coating over the surface of the chip to thereby expose the underlying semiconductor substrate or to cause shorts within the metallization pattern or between the metallization and the substrate.

Figure 2:
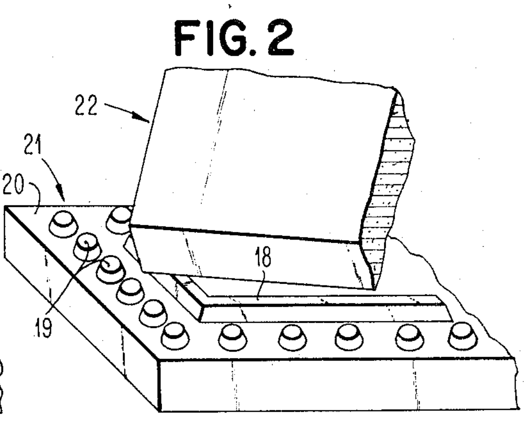
FIG. 2 is a fragmentary perspective view of the chip structure of the present invention in order to illustrate how the chip structure of the present invention inhibits damaging impact between two chips.

In FIG. 2, there is a generalized view of the chip structure of the present invention in order to illustrate how bumper projection 18, which is disposed intermediate pads or contact projections 19, prevents surface 20 of chip 21 from being impacted by chip 22. The bumper projection 18 and the contact projections 19 are disposed with respect to each other and with respect to the length, width and height of the chips in a configuration such that any corner of chip 22 is inhibited by the combination of the bumper projection 18 and contact projections 19 from contacting most of the surface area of planar surface 2 .

With respect to FIGS. 3 and 4, there will now be described an embodiment of the chip structure of the present invention.

Chip 30 comprises semiconductor substrate 31, of a material such as silicon, in which the active and passive devices (not shown) extend from planar surface 32. This planar surface is covered with a first insulative layer 33 on which metallization pattern 34 is selectively disposed and connected to the devices at planar surface 32 by openings (not shown) through insulative layer 33. A second insulative protective layer of a material such as glass is formed on metallization pattern 34 and insulative layer 33. Contact projections 36 project from the surface of insulative layer 35 and extend through insulative layer 35 to contact metallization pattern 34. Bumper projection 37 has substantially the same structure as contact projections 36 except that it does not contact metallization pattern 34. Instead, it extends through openings in insulative layer 35 and rests on insulative layer 33, thus being insulated from the semiconductor substrate 30. Contact projections 36 and bumper projection 37 have substantially the same structure of the pads described in U.S. Pat. No. 3,539,876. The lower portion of each pad may be seated either on metallization 34, in the case of contact projections 36, or directly on the surface of insulative layer 33, in the case of bumper projection 37. Each projection has an underlying portion 38 which may be conveniently formed of a chromium, copper, and gold composite described in U.S. Pat. No. 3,539,876, and the projection or pad proper 39 of each is formed of solder in the manner described in said patent. When formed in the manner described in U.S. Pat. No. 3,539,876, the bumper pads 37 and the contact pads 36 may be formed in a simultaneous operation, thus avoiding the necessity of costly extra steps in the bumper formation.

We have previously stated that the arrangement of the bumper projection 37, with respect to the pads 36 and with respect to the dimensions of the chip, i.e., the length, width and height or depth of the chip, should be such that a corner of a second chip of the same dimension is inhibited from impacting or contacting most of the areas on the chip surface.

Figure 5:
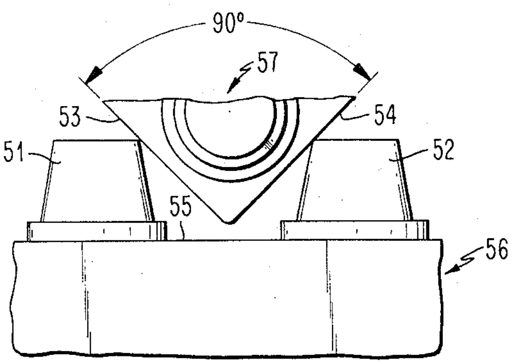
FIG. 5 and FIG. 6 are fragmentary diagrammatic views of pairs of cooperating projections to illustrate how the projections may be arranged in order to prevent any contact of the surface between the projections by another chip.
Figure 6:
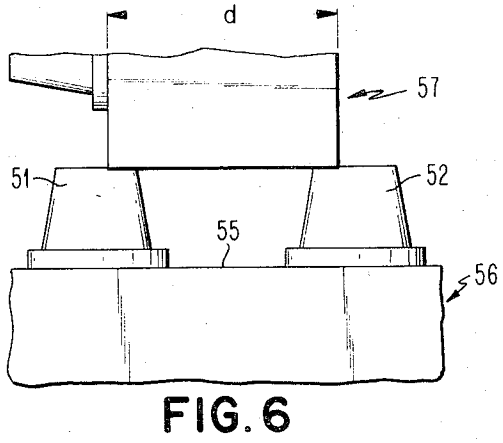

In order that a corner of the second chip be inhibited from contacting surface area between two projections, the projections must be sufficiently close to each other, with relation to the dimensions of the chip, to prevent such contact. This is illustrated in FIGS. 5 and 6 with respect to, let us say, a contact projection 51 and a bumper projection 52. As shown in FIG. 5, the distance between projections 51 and 52 must be such that a pair of tangents 53 and 54 respectively to projections 51 and 52 intersect at right angles above the intermediate surface 55 of the chip 56. In such a case, since the sides of the chips are at roughly right angles with respect to each other, the corners of second chip 57 will be suspended above the surface 55 intermediate the projections by projections 51 and 52. Similarly, in order to prevent the edge corner of chip 57, FIG. 6, from contacting intermediate surface 55, pads 51 and 52 must be spaced from each other by a distance of less than the depth *d* of the chip.

If the conductive contact projections and the bumper projection are arranged so that each projection is sufficiently close to its adjacent projection to meet the requirements of FIGS. 5 and 6 in every case, it would be impossible for a second chip to contact and damage any point on the surface of the chip. However, such an absolute inhibition should not be necessary in many cases where the present invention may be practiced. For example, with respect to FIG. 3, there are some areas on the surface of chip 30 which could be contacted by the corner of a second chip. Nevertheless, bumper projection 37 of chip 30 substantially reduces the possibility of damage due to impact. In this connection, it has been found that where the combination of the bumper projection and the contact pads is sufficient to inhibit or block chip contact with at least 75 percent of the surface area, the loss of chips to such impact damage is markedly reduced. It should be further noted that there are some areas on the surface of the chip wherein the breaking of the insulative or protective coating due to impact would not result in a loss of the chip. Such areas may be those in which the underlying areas in the semiconductor substrate are isolating regions rather than active or passive device regions. Similarly, for example, surface regions wherein the metallization pattern is at substantially the same potential as the underlying semiconductor region would also not be seriously impaired by impact which breaks through the insulating protective glass layer.

Figure 3:
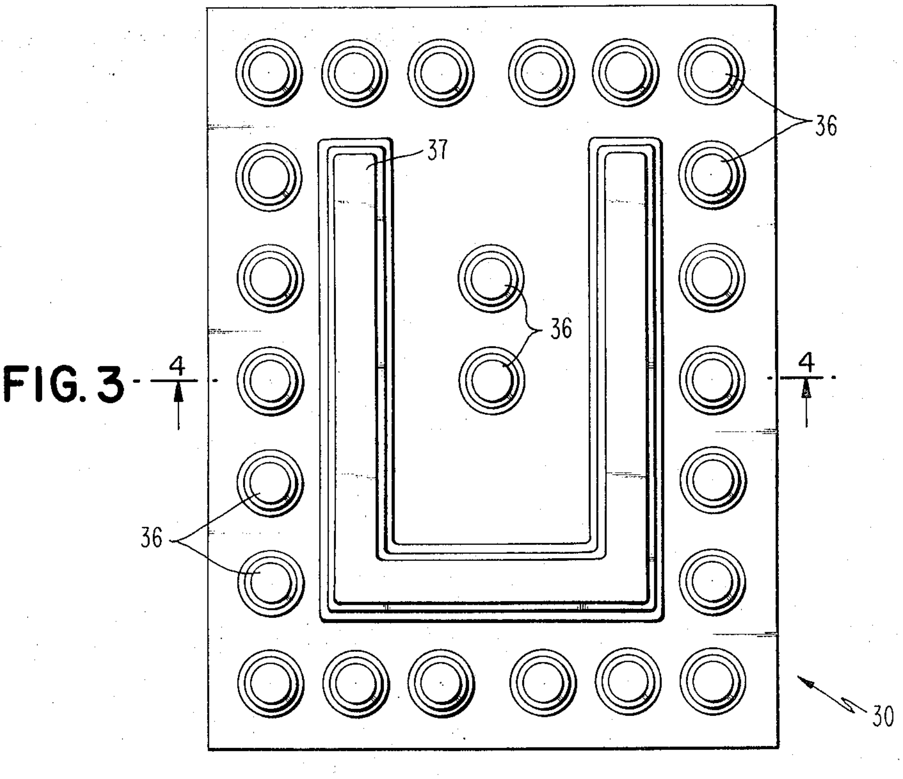
FIG. 3 is a diagrammatic top view of the chip projection structure of the present invention.
Figure 4:
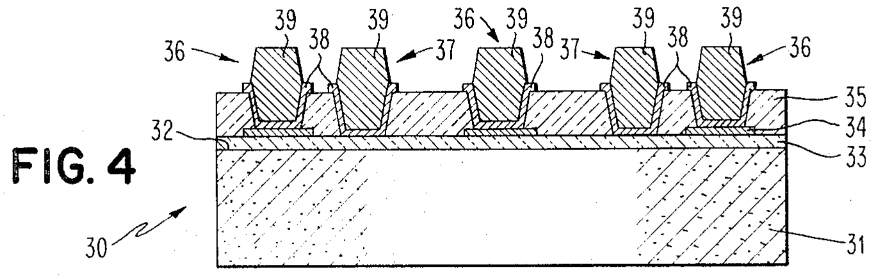
FIG. 4 is a diagrammatic cross-sectional view of FIG. 3 along lines 44.

While the bumper projection 37, shown in FIGS. 3 and 4, is a single projection not electrically connected to the substrate, it should be clear that a plurality of bumper projections may be arranged on the surface of the chip; in fact, the bumper projections could be constructed so as to have the same lateral proportions as the contact projections. In addition, the bumper projections may serve an auxiliary contact function by either being connected to the substrate or to portions of the metallization pattern.

The advantages of the structure of the present invention have been demonstrated with respect to chips piled in a vibratory bowl. However, it should be clear that the structure of the present invention will protect the chips in the same manner in other handling and storing equipment such as the previously mentioned random storage receptacles.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor integrated circuit chip structure having preselected height, width and length dimensions and comprising a protective layer of insulative material on one surface of the chip;

a plurality of spaced conductive electrical contact projections on said insulative layer and electrically connected to the integrated circuit, a portion of said contact projections being disposed about the periphery of said surface;

at least one bumper projection disposed on said insulative layer spaced from and inside of said peripheral contact projections and electrically isolated from the integrated circuit;

said bumper projection and said contact projections being disposed with respect to each other and with respect to said dimensions of the chip in a predetermined configuration such that a corner of another chip of the same structure and dimensions is inhibited by said configuration of projections from contacting selected areas on said insulative layer between said projections when said chips randomly contact each other during handling.

2. The semiconductor chip structure of claim 1 wherein the height of the bumper projection above said surface does not exceed the height of any one of said contact projections above said surface.

3. The semiconductor chip structure of claim 1 wherein said blocked areas are at least 75% of said surface area not covered by the contact pads.

4. The semiconductor chip structure of claim 2 wherein the bumper projection is of the same height as said contact projections.

5. The semiconductor chip structure of claim 4 wherein the bumper projection is conductive and has the same composition as said contact projections.

6. The semiconductor chip structure of claim 1 wherein the bumper projections are so disposed with respect to the contact projections that any tangent to said bumper projection which intersects with any tangent to one of said contact projections at a right angle will intersect at a point between said projections above said chip surface.

7. The semiconductor chip structure of claim 6 wherein said bumper projections and said contact projections are spaced from each other by a distance less than the chip height.

* * * * *